United States Patent [19]
Chang

[11] Patent Number: 5,687,325
[45] Date of Patent: Nov. 11, 1997

[54] APPLICATION SPECIFIC FIELD PROGRAMMABLE GATE ARRAY

[76] Inventor: Web Chang, 39939 Stevenson Common, V-2133, Fremont, Calif. 94538

[21] Appl. No.: 634,728

[22] Filed: Apr. 19, 1996

[51] Int. Cl.$^6$ .................................................. G06F 15/31
[52] U.S. Cl. .............................. 395/284; 326/39; 326/40; 326/41; 364/488; 364/489; 364/490; 364/716; 340/825.83; 340/825.87; 395/800
[58] Field of Search ........................... 326/39, 40, 41; 364/488, 489, 490, 716; 340/825.83, 825.87; 395/800, 284

[56] References Cited

U.S. PATENT DOCUMENTS 5,361,373  11/1994  Gilson .

OTHER PUBLICATIONS

Chip Express advertisement for "Laser Programmable Gate Array" (LPGA) published in *Upside* magazine during Nov. 1995.

*Primary Examiner*—Jack B. Harvey
*Assistant Examiner*—Rupal D. Dharia
*Attorney, Agent, or Firm*—Donald E. Schreiber

[57] ABSTRACT

An application specific field programmable gate array ("ASFPGA") includes at least two fixed functional units in a single IC chip. Depending upon a specific application for the ASFPGA, the fixed functional units may include one or more bus interfaces, event timers, an interrupt controller, a Direct Memory Access ("DMA") controller, system timers, a real-time clock, a Random Access Memory ("RAM"), a clock synthesizer, a RAM Digital-to-Analog Converter ("DAC"), a display interface, a register file, a compressed image encoder/decoder ("CODEC"), or similar functional units. The ASFPGA also includes a general purpose field programmable gate array ("FPGA"). The FPGA is configurable to effect a specific digital logic circuit interconnection between fixed functional units. After the FPGA has been configured, the fixed functional units together with the FPGA perform all the functions specified for a particular ASIC design.

12 Claims, 2 Drawing Sheets

APPLICATION SPECIFIC FIELD PROGRAMMABLE GATE ARRAY

BACKGROUND OF THE INVENTION

1. Field of the Invention

The present invention relates generally to designing integrated circuits ("ICs") and, more particularly, to the design of Application Specific Integrated Circuits ("ASICs").

2. Description of the Prior Art

ASICs are used extensively throughout digital computers and other types of electronic circuits. For example, ASIC System Logic Controller ("SLC") ICs perform various functions essential to a digital computer's operation including, in many instances, interfacing between a high-speed CPU bus and a slower speed Input/Output ("I/O") bus. Similarly, an ASIC super I/O IC, which is coupled to a digital computer's slower speed I/O bus, provides one or more serial ports, one or more parallel ports, a floppy diskette drive controller, and an interface for an Integrated Drive Electronics ("IDE") hard disk drive. Via a Small Computer System Interface ("SCSI") bus, ASICs also interface between a digital computer system's bus and a peripheral device, such as a disk drive, a printer, a scanner, a tape drive, a CD ROM drive or an optical storage drive. Computer display controller cards; Video on Demand set-top boxes; communication network systems such as 10BaseT and 100BaseT hubs, switches and routers; industrial embedded controllers such as those used in automobiles, portable and cellular telephones and household appliances; as well as special purpose systems used to access the Internet all use ASICs.

Because ASICs provide a truly cost-effective way of implementing a large number of digital logic circuits to perform a particular function, ASIC designers and IC fabricators have developed certain techniques for reducing the difficulty, expense and time required to design and debug an ASIC, and to manufacture the ASIC in quantity. One technique to facilitate implementing ASICs is known as a Gate Array. Using a Gate Array, an ASIC designer merely specifies interconnections among individual digital logic circuits arranged in a pre-specified two-dimensional array of logic gates. Alternatively, a designer may specify an ASIC by selecting Standard Cells from among a library of cells provided by an IC fabricator, specifying the location for Standard Cells on an IC chip, and specifying interconnections among the selected Standard Cells.

Because experience has established that ASICs are cost-effective, the number of circuits included in and the complexity of ASIC designs increases year by year. Obviously, increasing ASIC complexity increases the likelihood of design errors in engineering prototypes, and also increases the number of iterations required to obtain a design that is commercially practical.

Moreover, not only are ASIC designs becoming ever more complex, ASIC fabrication techniques are also advancing year by year. In the foreseeable future, ASIC geometry will decreases from 0.8 micron feature size to 0.5 micron, 0.35 micron or even smaller feature size, while the size of IC wafers used for ASIC fabrication will concurrently increase in diameter from 6 inches to 8 inches. More complex ASIC designs will also require increasing the number of metalization layers from the 2 or 3 layers used at present to 5 or more layers of metalization. Fabricating each layer of metalization requires a different IC mask. The compounding effects of using ever smaller feature size on ever larger diameter IC wafers with an increasing number of metalization layers will significantly increase the Non-Recurring Expense ("NRE") of ASIC design, debugging and development.

For example, in the future the price of masks used in ASIC fabrication will increase from $2,000 per mask at present for 0.8 micron feature size geometry on a 6 inch diameter wafer to $10,000 per mask for 0.35 micron feature size geometry on an 8 inch diameter wafer. Consequently, because an average of four (4) to ten (10) masks will, in general, be required to fabricate future ASICs, NRE for each engineering prototype run will increase from $50,000 to $90,000 at present to perhaps $250,000 in the foreseeable future. An anticipated increase in wafer diameter from 8 inches to 12 inches will further increase the NRE for fabricating engineering prototypes.

Compounding all of the preceding technological considerations, that will surely increase the NRE of ASIC engineering, is the business reality that product life cycles continue to decrease. Traditional 4 to 8 week turn-arounds for fabricating an ASIC engineering prototype combined with 12 to 14 week lead times for ASIC production are becoming too long for product life cycles. Ever decreasing product life cycles in comparison with an ASIC's production cycle makes ASIC inventory control more difficult. For example, a particular ASIC design may become obsolete before exhausting a conventional three month inventory of the ASIC product.

There exist alternative ICs which digital logic designers may, in some instances, substitute for an ASIC. These alternatives, some of which are known as Field Programmable Gate Arrays ("FPGAs"), Programmable Array Logic ("PALs"), or Gate Array Logic ("GALs"), permit a digital logic designer to electronically program an IC to perform an application specific digital logic function. Moreover, some of these devices are electronically re-programmable, which, obviously, dramatically shortens the time for, and expense of fabricating and debugging a prototype ASIC. Consequently, electronically creating an ASIC by merely programming a standard IC appears highly desirable in comparison with physically manufacturing an ASIC. Unfortunately, in many instances presently available programmable logic devices such as FPGAs, PALs and GALs prove excessively expensive, particularly for high-volume products. Moreover, such ICs cannot, in general, provide a circuit density and/or circuit performance comparable to those readily obtainable using ASICs, i.e. levels of circuit density and/or performance that are necessary to produce a state-of-the-art product.

To address the preceding difficulties in ASIC prototype fabrication, Laser Programmable Gate Arrays ("LPGA") have been developed which permits prototyping an ASIC in one day. However, LPGAs are suitable only for low volume ASIC production, while mass production requires conventional ASIC fabrication. Moreover, because a LPGA is a Gate Array, it cannot provide the circuit density of a conventional ASIC, nor can it achieve an ASIC's electrical performance. Moreover, laser ASIC prototyping appears to require complicated, expensive, high-precision prototyping equipment that must be located in a centralized facility to which designs are transmitted for prototype fabrication. Finally, it appears that it will be difficult for laser prototyping to effectively and fully exploit the small feature size that foreseeable ASICs will employ, or large number of devices which such ICs will provide. Thus, while ASIC prototype fabrication using LPGAs, in some instances, offers an improvement over conventional ASIC prototype fabrication, the NRE still remains costly in comparison with directly re-programmable FPGAs, PALs or GALs, and implementing an ASIC using a LPGA remains less convenient and more opaque to IC designers than directly programmable devices.

SUMMARY OF THE INVENTION

The present invention provides standardized ICs that are electronically programmable to obtain a high-performance ASIC having high circuit density.

An object of the present invention is to provide a standardized ICs that may be quickly programmed to obtain a high-performance, high-density ASIC.

Another object of the present invention is to provide a standardized re-programmable ICs that may be programmed to obtain a high-performance, high-density ASIC.

Another object of the present invention is to provide a high-performance, high-density ASIC without fabricating customized IC masks.

Another object of the present invention is to more quickly provide a high-performance, high-density ASIC engineering proto-type.

Another object of the present invention is to provide a more quickly debugged ASIC engineering prototype.

Another object of the present invention is to provide an IC that avoids ASIC obsolescence.

Briefly, the present invention is an application specific field programmable gate array ("ASFPGA") that includes at least two fixed functional units in a single IC chip. Depending upon a specific application for the ASFPGA, the fixed functional units may include one or more bus interfaces, event timers, an interrupt controller, a Direct Memory Access ("DMA") controller, system timers, a real-time clock, a Random Access Memory ("RAM"), a clock synthesizer, a RAM Digital-to-Analog Converter ("DAC"), a display interface, a register file, a compressed image encoder/decoder ("CODEC"), or similar functional units. The ASFPGA also includes a general purpose field programmable gate array ("FPGA"). The FPGA is configurable to effect a specific digital logic circuit interconnection between fixed functional units. After the FPGA has been configured, the fixed functional units together with the FPGA perform all the functions specified for a particular ASIC design.

Because an ASFPGA includes a general purpose FPGA which interconnects among fixed functional units included in the ASFPGA, only appropriate FPGA configuration data need be loaded into the FPGA to customize the ASFPGA into a particular ASIC. The simplicity and speed with which an ASFPGA may be configured into a custom ASIC is markedly different from the long and expensive procedure required to fabricate an ASIC using multiple conventional integrated circuit masks and conventional integrated circuit fabrication techniques. Moreover, once an ASFPGA has been configured into a particular ASIC, it may be reconfigured, virtually instantaneously, into a different ASIC merely by loading a different set of configuration data into the FPGA. These and other features, objects and advantages will be understood or apparent to those of ordinary skill in the art from the following detailed description of the preferred embodiment as illustrated in the various drawing figures.

DETAILED DESCRIPTION OF THE PREFERRED EMBODIMENT

Figure 1:
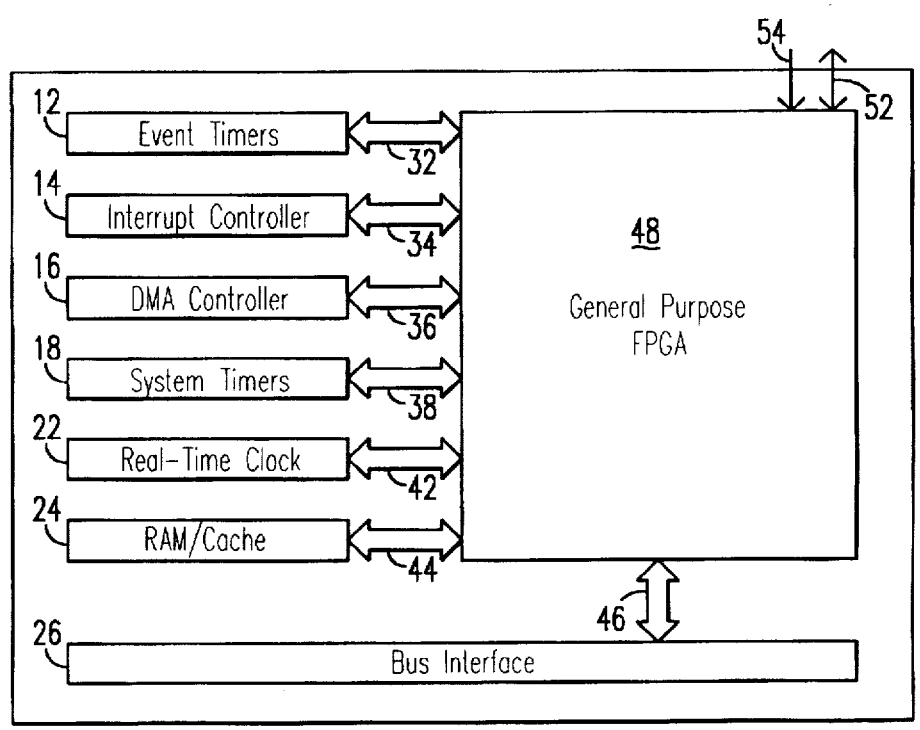
FIG. 1 is a functional block diagram depicting an application specific field programmable gate array in accordance with the present invention for a SLC.

Referring now to FIG. 1, depicted there is an application specific field programmable gate array ("ASFPGA") in accordance with the present invention implementing a SLC ASIC that is referred to by the general reference character 10. The SLC 10 is adapted for use in conjunction with a microprocessor Central Processing Unit ("CPU"), Dynamic Random Access Memory ("DRAM"), I/O controller ICs, a graphic controller IC, a keyboard controller IC, etc. to provide a personal computer system.

The SLC 10 includes a set of general purpose event timers 12 which can be set by a computer program executed by a CPU to generate an interrupt after a specified interval of time elapses. The SLC 10 also includes a interrupt controller 14 that permits a computer system to efficiently service interrupts from devices such as event timers, keyboards, displays, communication devices, floppy disks, printers, and hard disks. The interrupt controller 14 accepts interrupts from the devices, determines which interrupt has the highest priority (importance), ascertains whether the incoming interrupt has a higher priority than the level currently being serviced, and issues an interrupt to the computer system's CPU based upon these determinations. Examples of the interrupt controller 14 include an Intel Corporation ("Intel") 8259A/8259A-2 Programmable Interrupt Controller and 82C59A-2 CHMOS Programmable Interrupt Controller that are described in "Peripheral Components," © Intel Corporation, 1995. In a personal computer system, the use of the interrupt controller 14 avoids software overhead that accompanies "polling" in which a computer program executed by the CPU periodically interrogates every device included in the personal computer system to determine if the device requires servicing.

The SLC 10 also includes a DMA controller 16 which is a specialized processor that, without intimate involvement of the CPU, effects a high-speed transfer of information between a device, such as a floppy diskette drive or a hard-disk drive, and the personal computer system's DRAM. Examples of the DMA controller 16 include an Intel 8237A/8237A-5 High Performance Programmable DMA Controller and 82D37A-5 CHMOS High Performance Programmable DMA Controller that are described in "Peripheral Components."

The SLC 10 also includes system timers 18, an example of which is an Intel 8253/8253A-5 High Programmable Interval timer that are described in "Peripheral Components." The system timers 18 initiate DRAM refresh cycles, provide a clock signal which may be used by a computer program for generating sounds, and which also cause a time value present in a real-time clock 22 to be periodically copied from the real-time clock 22 to a pre-specified memory location in the DRAM. The real-time clock 22 duplicates a real-time clock service that is maintained by the operating system of the personal computer. The real-time clock 22 maintains not only hours, minutes and seconds, but also day, month, year and even century. The SLC 10 may include the real-time clock 22 so time will be maintained even if the digital computer system enters a low power operating mode which turns off the CPU.

The SLC 10 also preferably includes some RAM 24, that may or may not function as a cache, which may temporarily store data being transferred between a device and the DRAM, or conversely. To facilitate such transfers, the SLC 10 includes at least one bus interface 26. The bus interface 26 permits the SLC 10 to exchange data with a bus included in a digital computer system such as, for example, an Industry Standard Architecture ("ISA") bus, an Extended Industry Standard Architecture ("EISA") bus, a Video Electronics Standards Association ("VESA") bus, a Peripheral Component Interconnect ("PCI") bus, or a VerasModule Eurocard ("VME") bus. In high performance digital computer systems, such as those which use an Intel Pentium microprocessor CPU, the SLC 10 may, in fact, include two different bus interfaces 26, one which interfaces a PCI bus, and another which interfaces an ISA, an EISA, or a SCSI bus. Examples of ASICs that include two bus interfaces 26 include an Intel 82378 System I/O and 82375EB/82375SB PCI-EISA Bridge that are described in "Peripheral Components."

The event timers 12, the interrupt controller 14, the DMA controller 16, the system timers 18, the real-time clock 22, the RAM 24, and the bus interface 26, which are referred to generically herein as fixed functional units, are respectively coupled by buses 32, 34, 36, 38, 42, 44 and 46 to a general purpose FPGA 48. Each of the functional units 12, 14, 16, 18, 22, 24 and 26 is fixed in the sense that it is fabricated with conventional ASIC technology. Consequently the various electrical connections within each fixed functional unit are not physically alterable as with a Gate Array, or electrically alterable as with a FPGA. Therefore, each of the functional units possesses the same circuit density as an ASIC fabricated with a particular technology, and also provides that technology's performance characteristics.

While the name fixed functional units is applied collectively to these units herein, individual fixed functional units may, in fact, be programmed in the sense that the term "programmed" is used with regard to a computer program executed by a CPU. For example, a computer program executed by the CPU may program the event timers 12 by storing into one of the event timers 12 data representing a time interval after which one of the event timers 12 generates an interrupt. Similarly, a computer program executed by the CPU may mask certain interrupts that are processed by the interrupt controller 14. Analogously, a computer program executed by the CPU may set the time and date maintained by the real-time clock 22.

The FPGA 48, which may be of a type marketed by Xilinx, Inc., 2100 Logic Drive, San Jose, Calif. 95124, may, in general, be programmed to perform the functions of a custom Large-Scale Integration ("LSI") circuit. In comparison with other ASIC fabrication technologies such as a Gate Array or a LPGA, a FPGA is electronically programmable, and even electronically re-programmable after being incorporated into a digital computer system, whereas a Gate Array or an LPGA cannot be reprogrammed. Programmability of a FPGA permits hardware constituting an LSI circuit implemented by the FPGA to be changed as easily as software. Such programming a FPGA configures the FPGA to perform specific digital logic functions.

During FPGA configuration, a clock signal, generated either by the FPGA or by a device external to the FPGA, is present on a configuration-clock signal-line 52. In response to this clock signal, configuration data from a memory, such as a Programmable Read Only Memory ("PROM") not illustrated in FIG. 1, may be stored serially into the FPGA via a configuration-data signal-line 54, or in parallel over a configuration-data bus not illustrated in FIG. 1. After configuration data has been loaded into the FPGA, the FPGA then executes a start-up sequence that ensures an orderly transition from configuration of the FPGA to its intended operation as a custom LSI circuit.

As used in an ASFPGA such as the SLC 10, the FPGA 48 must be configured to effect a specific digital logic circuit interconnection required for the various fixed functional units 12, 14, 16, 18, 22, 24 and 26 included in the SLC 10 to cooperatively provided the functions specified for the SLC 10. Thus, for fixed functional units such as the event timers 12 into which data must be stored via the bus interface 26, the FPGA 48 must be configurable to permit addressing each individual event timer 12 by signals presented to the bus interface 26, and for storing into the addressed event timer 12 data presented to the bus interface 26. Similarly, for a fixed functional unit such as the interrupt controller 14 which must transmit a signal, such as an interrupt signal, via the bus interface 26 to the CPU of a digital computer system, the FPGA 48 must be configurable to effect a transfer of such a signal. In general, the FPGA 48 must possess sufficient capacity to permit effecting, in a single configuration loaded into the FPGA 48 via the configuration-data signal-line 54, all the digital logic circuit connections required for the fixed functional units 12, 14, 16, 18, 22, 24 and 26 to perform their specified functions.

While the requirement that the FPGA 48 be configurable to permit the fixed functional units 12, 14, 16, 18, 22, 24 and 26 to perform concurrently all the functions specified for the SLC 10 establishes a minimum capability that the FPGA 48 must provide, if the FPGA 48 possess digital logic circuit resources in excess such a minimum capability, then configuration of the FPGA 48 may also create within the FPGA 48 functional units that perform functions in addition to those provided by the fixed functional units 12, 14, 16, 18, 22, 24 and 26. Examples of possible additional functions that might be provided by a FPGA 48 included in an ASFPGA SLC 10 are disclosed in International Patent Cooperation Treaty patent application WO 95/28671 entitled "An Improved System Logic Controller For Digital Computers" published 26 Oct. 1995, that is incorporated herein by reference.

Figure 2:
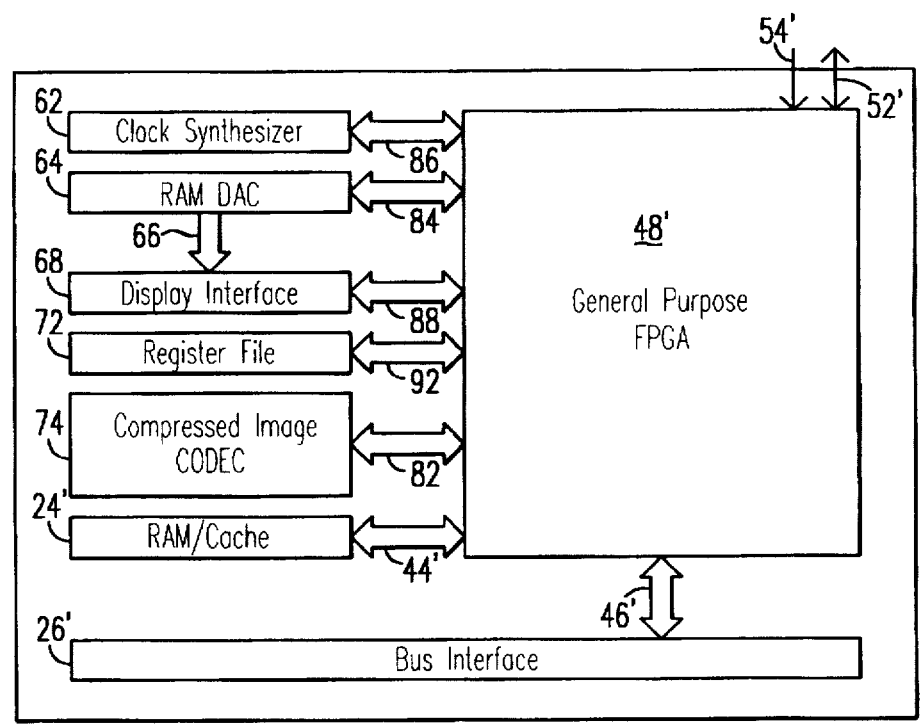
FIG. 2 is a functional block diagram depicting an application specific field programmable gate array in accordance with the present invention for a graphic controller.

Referring now to FIG. 2, depicted there is a graphic controller 60 implemented using an ASFPGA. Those elements of the graphic controller 60 depicted in FIG. 2 that are common to the SLC 10 depicted in FIG. 2 carry the same reference numeral distinguished by a prime (" ' ") designation. The graphic controller 60 includes a clock synthesizer 62 that generates timing signals for a display device's horizontal scan line interval, and vertical scan interval. The graphic controller 60 also includes a RAM DAC 64 that converts digital data values specifying an image to be displayed on a display device into analog signals that are capable of producing an image on a display device. The RAM DAC 64 includes RAM into which is loaded data for a Color Look-Up Table ("CLUT"). Subsequently, data specifying each successive Picture Element ("PIXEL" or "PEL") in the image is presented to the RAM DAC 64 to address a specific location in the RAM thereby fetching the color value specified by the CLUT which is stored at the addressed RAM location. Within the RAM DAC 64, the color value specified by the CLUT is presented to DACs included in the RAM DAC 64 which convert CLUT data values into analog signals for producing an image on the display device.

The analog signals produced by the RAM DAC 64 that are capable of producing an image on a display device are transmitted over a bus 66 to a display interface 68 that is also included in the graphic controller 60. The display interface 68 converts the analog signals into signals suitable for transmission directly to either a Cathode Ray Tube ("CRT") display or a Liquid Crystal Display ("LCD") for producing an image directly thereon.

A register file 72 included in the graphic controller 60 receives and stores data by which a computer program executed by the CPU specifies a particular operating mode for the graphic controller 60. For example, data stored in the register file 72 determines whether the graphic controller 60 operates to interface a CRT or a LCD, or to select a particular operating mode for a CRT display.

The graphic controller 60 may also include a compressed image CODEC 74. If the CODEC 74 operates as a decoder, the CODEC 74 receives compressed digital video data and converts such data into uncompressed digital video data. The uncompressed digital video data produced by the CODEC may then be transferred via a bus 82, the FPGA 48' and another bus 84 to the RAM DAC 64 for conversion from digital data into an analog signal. If the CODEC 74 operates as an encoder, it receives uncompressed digital video data and converts such data into compressed digital video data. The compressed image CODEC may be adapted for compressing and/or decompressing images in accordance with the Joint Photographic Experts Group ("JPEG") standard, the Moving Picture Experts Group ("MPEG") standard, either MPEG-I or MPEG-II, or other digital image compression technique that is already known or may be developed in the future.

In addition to the buses 82 and 84, the graphic controller 60 also includes buses 86, 88 and 92 which respectively interconnect the clock synthesizer 62, the display interface 68 and the register file 72 with the FPGA 48'. Similar to the FPGA 48, the FPGA 48' must possess sufficient capacity to permit effecting, in a single configuration loaded into the FPGA 48' via the configuration-data signal-line 54', a specific digital logic circuit interconnection among the fixed functional units 24', 26', 62, 64, 68, 72, and 74 which permits them to perform their respective functions within the graphic controller 60.

Figure 3:
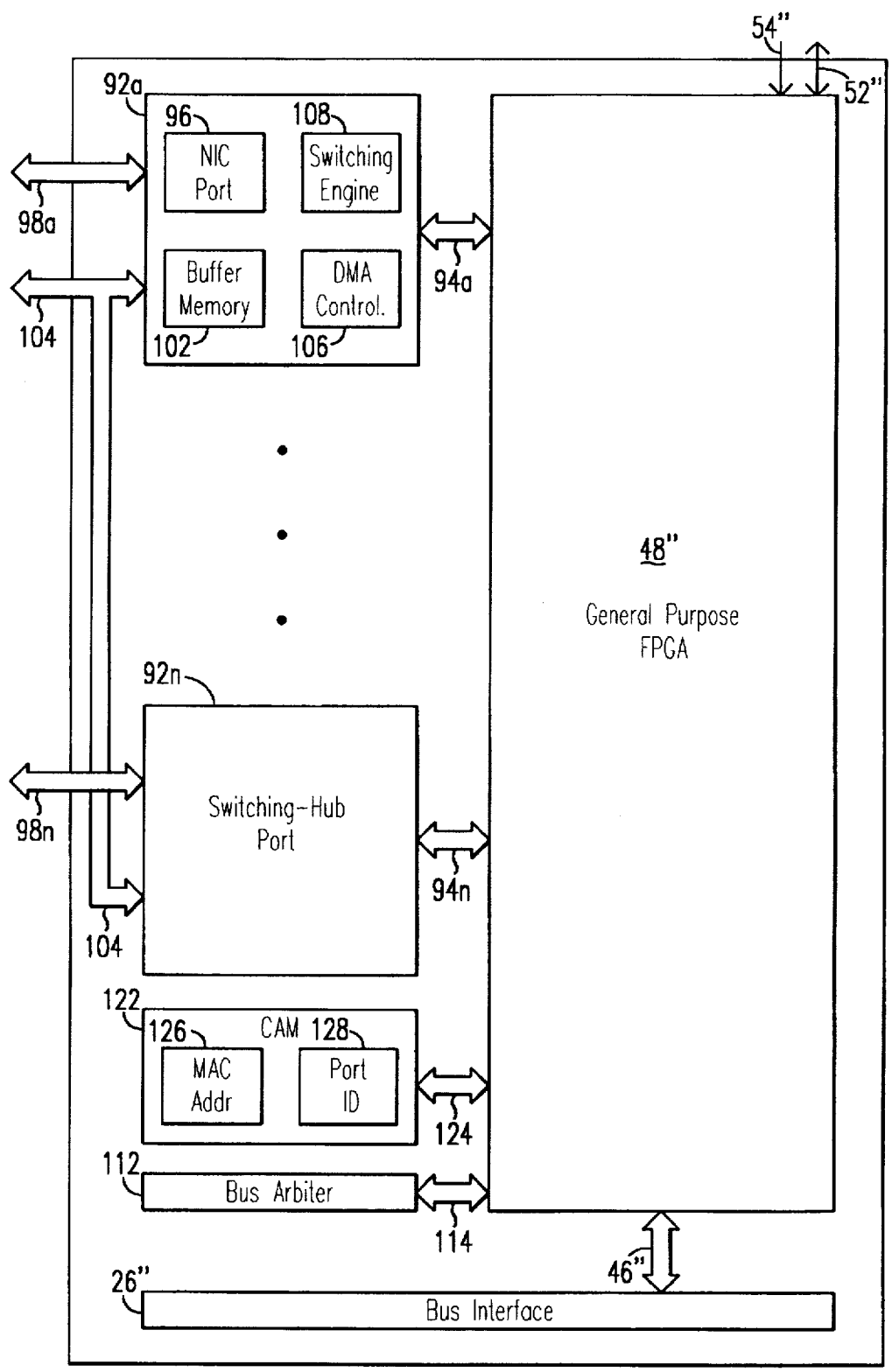
FIG. 3 is a functional block diagram depicting an application specific field programmable gate array in accordance with the present invention for an intelligent network switching hub.

Referring now to FIG. 3, depicted there is a functional block diagram for an intelligent network switching hub 90 implemented using an ASFPGA. Those elements of the switching hub 90 depicted in FIG. 3 that are common to the SLC 10 depicted in FIG. 1 and to the graphic controller 60 depicted in FIG. 2 carry the same reference numeral distinguished by a double prime (" " ") designation. For the switching hub 90, the bus interface 26" provides a port into the switching hub 90 which permits a computer program executed by an external CPU to configure the switching hub 90, and to also gather data about network activities and status, which can then be analyzed to provide statistics for managing the network.

In addition to the bus interface 26" and the FPGA 48", the switching hub 90 includes a plurality of identical switching-hub ports 92a through 92n. Each of the switching-hub ports 92a through 92n is respectively coupled by a bus 94a through 94n to the FPGA 48". Each switching-hub ports 92a through 92n also includes a network interface circuit ("NIC") port 96 that couples to a separate network cable 98a through 98n such as 10BaseT cabling, or 100BaseT cabling. Either directly within each of the switching-hub ports 92a through 92n or via the FPGA 48", each NIC port 96 is coupled to a buffer memory 102 that temporarily stores portions of or entire packets of data received by the NIC port 96 from the network cable 98a through 98n, or to be transmitted by the NIC port 96 to the network cable 98a through 98n. The buffer memories 102 included in each of the switching-hub ports 92a through 92n connect in parallel to a memory bus 104 for exchanging data between pairs of buffer memories 102. External to the switching hub 90, a conventional RAM, not illustrated in FIG. 3, may also connect to the memory bus 104 for storing larger amounts of data than can be stored within each buffer memory 102. The memory bus 104 may also be used for interconnecting multiple switching hubs 90.

To permit swiftly and efficiently transferring data between pairs of buffer memories 102, each of the switching-hub ports 92a through 92n includes a DMA controller 106 that couples to the buffer memory 102 either directly within each of the switching-hub ports 92a through 92n or via the FPGA 48". The DMA controller 106 permits transferring packets of data between pairs of buffer memories 102 in burst mode over the memory bus 104. To supervise and direct transfers of data packets between pairs of buffer memories 102, each of the switching-hub ports 92a through 92n also includes a switching engine 108 that instigates a table look-up, using a device address included in each packet of data, to identify the proper switching-hub port 92a through 92n for a data transfer between pairs of buffer memories 102 via the memory bus 104.

To resolve contention among the switching-hub ports 92a through 92n for access to the memory bus 104, the switching hub 90 includes a bus arbiter 112 that is coupled to the FPGA 48" via a bus 114. Digital logic implemented within the FPGA 48" transmits signals from each of the switching-hub ports 92a through 92n to the bus arbiter 112 that indicate when a particular switching-hub port 92a through 92n needs access to the memory bus 104. Such digital logic also transmits signals from the bus arbiter 112 to each of the switching-hub ports 92a through 92n granting or withholding permission to each individual switching-hub port 92a through 92n to access the memory bus 104.

To provide address filtering needed to supervise and coordinate the operation of all of the switching-hub ports 92a through 92n, the switching hub 90 includes a content addressed memory ("CAM") 122 that is coupled to the FPGA 48" by a bus 124. The CAM 122 includes a Media Access Control ("MAC") table 126 which stores addresses for all devices which may exchange data with a particular switching-hub port 92a through 92n. The CAM 122 also includes a port ID table 128 which stores an ID for the switching-hub port 92a through 92n through which a particular device may exchange data. The switching engine 108 transmits the device address included in a packet of data received by a switching-hub port 92a through 92n, which specifies that packet's destination, to the CAM 122 via the FPGA 48". Within the CAM 122, the device address is presented to the MAC table 126 as an index to look up the device's corresponding port ID in the port ID table 128. The port ID thus obtained is then transmitted from the CAM 122 through the FPGA 48" to the switching engine 108 in the switching-hub port 92a through 92n that transmitted the device address. Upon receiving the port ID, the switching engine 108 then arbitrates with the bus arbiter 112 via the FPGA 48" for access to the memory bus 104. After the switching engine 108 receives permission for the switching-hub port 92a through 92n to access the memory bus 104, as described above the packet of data is transferred via the memory bus 104 from the buffer memory 102 of the switching-hub port 92a through 92n receiving the port ID to the buffer memory 102 of the switching-hub port 92a through 92n specified by the port ID.

Although the present invention has been described in terms of the presently preferred embodiment, it is to be understood that such disclosure is purely illustrative and is not to be interpreted as limiting. For example, rather than using a re-programmable general purpose FPGA technology for interconnecting the various fixed functional logic units of a ASFPGA in accordance with the present invention into a functional ASIC, for production devices it may prove advantageous to employ a write once digital programmable logic technology, such as a GAL technology, rather than re-programmable FPGA technology. In production, after an ASIC has been fully developed, use of a re-programmable technology may be undesirable, and could even be disadvantageous. Accordingly, an ASFPGA in accordance with the present invention may employ either a re-programmable FPGA technology, or a write once programmable digital logic technology. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. An application specific field programmable gate array ("ASFPGA") comprising:
   at least two fixed functional units included in a single integrated circuit ("IC") chip; and
   a general purpose field programmable gate array ("FPGA") also included in the IC chip, said FPGA interconnecting the fixed functional units, and being programmable to effect a specific digital logic circuit interconnection of the fixed functional units.

2. The ASFPGA of claim 1 wherein at least one of the fixed functional units is a bus interface.

3. The ASFPGA of claim 2 wherein the bus interface is an industry standard architecture ("ISA") bus interface.

4. The ASFPGA of claim 2 wherein the bus interface is an Peripheral Component Interconnect ("PCI") bus interface.

5. The ASFPGA of claim 4 wherein the ASFPGA includes a second bus interface.

6. The ASFPGA of claim 5 wherein the second bus interface is an ISA bus interface.

7. The ASFPGA of claim 1 wherein the ASFPGA is a System Logic Controller ("SLC").

8. The ASFPGA of claim 7 wherein the SLC includes interrupt controller fixed functional unit and a Direct Memory Access ("DMA") controller fixed functional unit that are all coupled to said FPGA.

9. The ASFPGA of claim 1 wherein the ASFPGA is a graphic controller.

10. The ASFPGA of claim 9 wherein the graphic controller includes Random Access Memory ("RAM") Digital-to-Analog Converter ("DAC") fixed functional unit and a display interface fixed functional unit that are all coupled to said FPGA.

11. The ASFPGA of claim 10 wherein the ASFPGA is a switching hub.

12. The ASFPGA of claim 11 wherein the switching hub is includes a switching-hub port fixed functional unit, a bus arbiter fixed functional unit; and a content addressed memory ("CAM") fixed functional unit that are all coupled to said FPGA.

* * * * *

US005687325C1

(12) EX PARTE REEXAMINATION CERTIFICATE (10354th)
United States Patent
Chang

(10) Number: US 5,687,325 C1
(45) Certificate Issued: Oct. 23, 2014

(54) APPLICATION SPECIFIC FIELD PROGRAMMABLE GATE ARRAY

(75) Inventor: Web Chang, Fremont, CA (US)

(73) Assignee: Intellectual Ventures II LLC, Wilmington, DE (US)

Reexamination Request:
No. 90/011,507, Feb. 25, 2011
No. 90/012,787, Feb. 5, 2013

Reexamination Certificate for:
Patent No.: 5,687,325
Issued: Nov. 11, 1997
Appl. No.: 08/634728
Filed: Apr. 19, 1996

(51) Int. Cl.
*G06F 15/78* (2006.01)
(52) U.S. Cl.
USPC ............... 710/104; 326/39; 326/40; 326/41; 340/14.3; 708/232; 712/34; 712/36; 712/43; 716/117
(58) Field of Classification Search
None
See application file for complete search history.

(56) References Cited

To view the complete listing of prior art documents cited during the proceedings for Reexamination Control Numbers 90/011,507 and 90/012,787, please refer to the USPTO's public Patent Application Information Retrieval (PAIR) system under the Display References tab.

*Primary Examiner* — Cameron Saadat

(57) ABSTRACT

An application specific field programmable gate array ("ASF-PGA") includes at least two fixed functional units in a single IC chip. Depending upon a specific application for the ASF-PGA, the fixed functional units may include one or more bus interfaces, event timers, an interrupt controller, a Direct Memory Access ("DMA") controller, system timers, a real-time clock, a Random Access Memory ("RAM"), a clock synthesizer, a RAM Digital-to-Analog Converter ("DAC"), a display interface, a register file, a compressed image encoder/decoder ("CODEC"), or similar functional units. The ASF-PGA also includes a general purpose field programmable gate array ("FPGA"). The FPGA is configurable to effect a specific digital logic circuit interconnection between fixed functional units. After the FPGA has been configured, the fixed functional units together with the FPGA perform all the functions specified for a particular ASIC design.

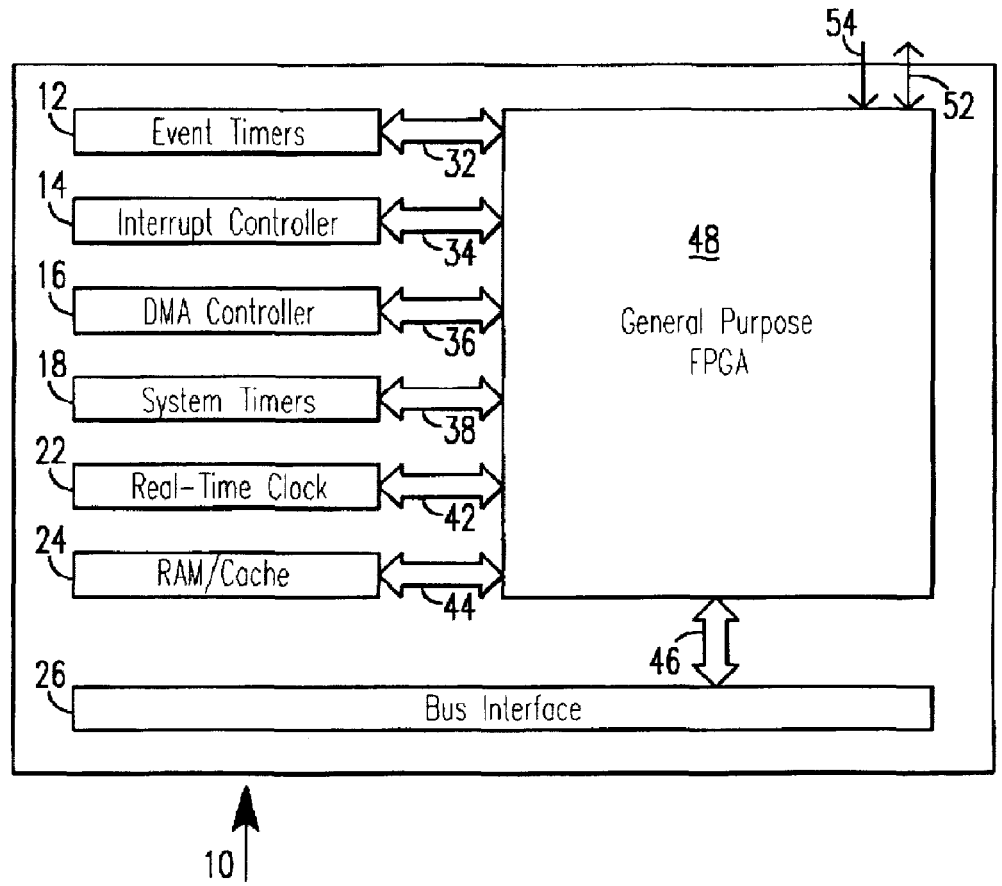

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 7-12 are cancelled.

Claim 2 is determined to be patentable as amended.

Claims 3-6, dependent on an amended claim, are determined to be patentable.

New claims 13-17 are added and determined to be patentable.

2. The ASFPGA of claim [1] *21* wherein at least one of the fixed functional units is a bus interface.

*13. An application specific field programmable gate array ("ASFPGA") comprising:*
  *at least two fixed functional units included in a single integrated circuit ("IC") chip; and*
  *a general purpose field programmable gate array ("FPGA") also included in the IC chip, said FPGA interconnecting the fixed functional units, and being programmable to effect a specific digital logic circuit interconnection of the fixed functional units;*
  *wherein the ASFPGA is a switching hub*
  *wherein the switching hub includes a switching-hub port fixed functional unit, a bus arbiter fixed functional unit; and a content addressed memory ("CAM") fixed functional unit that are all coupled to said FPGA;*
  *wherein the CAM fixed functional units comprises:*
    *a Media Access Control ("MAC") table configured to store an address of a device exchanging data with the switching-hub port fixed functional unit; and*
    *a port ID table configured to store an ID for the switching-hub port fixed functional unit through which the device exchanges data, wherein the CAM fixed functional unit is configured to:*
      *receive, through the FPGA, a device address included in a data packet from a first switching-hub port fixed functional unit,*
      *determine a port ID for a second switching-hub port fixed functional unit based on the device address, and*
      *transmit, through the FPGA, the port ID to the first switching-hub port fixed functional unit,*
      *wherein, the data packet is transferred from the first switching-hub port fixed functional unit to the second switching-hub port fixed functional unit.*

*14. The ASFPGA of claim 13, wherein the switching hub further includes a plurality of switching-hub port fixed functional units including the switching-hub port fixed functional units,*
  *wherein the FPGA is programmable to:*
    *transmit signals from the plurality of switching-hub port fixed functional units to the bus arbiter fixed functional unit, wherein the bus arbiter fixed function unit is configured to indicate when a particular switching-hub port fixed functional unit accesses a memory bus; and*
    *transmit signals from the bus arbiter fixed function unit to the plurality of switching-hub port fixed functional units, granting or withholding permission to access the memory bus.*

*15. The ASFPGA of claim 13, wherein the FPGA is configurable to receive configuration data serially or in parallel over a configuration data bus.*

*16. The ASFPGA of claim 13, further comprising a memory configured to store configuration data for the general purpose FPGA.*

*17. The ASFPGA of claim 16, wherein the memory is a programmable read only memory.*

\* \* \* \* \*